(12) United States Patent
Berroteran

(10) Patent No.: US 12,255,572 B1
(45) Date of Patent: Mar. 18, 2025

(54) SYSTEM AND METHOD FOR DETECTING A STATOR DISTORTION FILTER IN AN ELECTRICAL POWER SYSTEM

(71) Applicant: GE Infrastructure Technology LLC, Greenville, SC (US)

(72) Inventor: Igor Berroteran, Salem, VA (US)

(73) Assignee: GE Infrastructure Technology LLC, Greenville, SC (US)

(*) Notice: Subject to any disclaimer, the term of this patent is extended or adjusted under 35 U.S.C. 154(b) by 0 days.

(21) Appl. No.: 18/541,802

(22) Filed: Dec. 15, 2023

(51) Int. Cl.
*H02P 9/10* (2006.01)
*F03D 9/25* (2016.01)
*H02P 9/00* (2006.01)
*H02P 101/15* (2016.01)

(52) U.S. Cl.
CPC .............. *H02P 9/102* (2013.01); *F03D 9/255* (2017.02); *H02P 9/007* (2013.01); *F05D 2220/76* (2013.01); *F05D 2270/053* (2013.01); *H02P 2101/15* (2015.01)

(58) Field of Classification Search
CPC ...... H02P 9/102; H02P 9/007; H02P 2101/15; F03D 9/255; F05D 2220/76
See application file for complete search history.

(56) References Cited

U.S. PATENT DOCUMENTS

| | | | |
|---|---|---|---|
| 7,888,915 B2 | 2/2011 | Zhao et al. | |
| 8,898,025 B2 | 11/2014 | Yin et al. | |
| 8,994,359 B2 | 3/2015 | Neti et al. | |
| 11,437,895 B2 | 9/2022 | Salter et al. | |

FOREIGN PATENT DOCUMENTS

| | | |
|---|---|---|
| CN | 104242762 A | 12/2014 |
| CN | 105301499 A | 2/2016 |
| CN | 208607331 U | 3/2019 |
| CN | 112821459 A | 5/2021 |
| CN | 213637482 U | 7/2021 |
| CN | 115015750 A | 9/2022 |
| EP | 2296265 A2 | 3/2011 |
| EP | 2299568 A1 | 3/2011 |
| EP | 2565658 A1 | 3/2013 |
| WO | WO2017/028028 A1 | 2/2017 |

*Primary Examiner* — Sean Gugger
(74) *Attorney, Agent, or Firm* — Dority & Manning, P.A.

(57) ABSTRACT

A method of detecting whether a stator distortion filter is connected to a generator of an electrical power system includes temporarily interrupting magnetic flux excitation of a generator of the electrical power system. The method also includes observing a sinusoidal waveform of one or more electrical feedbacks of the generator. Further, when the sinusoidal waveform persists longer than a predefined duration, the method includes determining that the passive load is connected to the generator of the electrical power system. When the sinusoidal waveform abruptly decays below a threshold in a time period less than the predefined duration, the method includes determining that the passive load is not connected to the generator of the electrical power system. Moreover, the method includes implementing a control action based on whether the passive load is connected to the generator of the electrical power system.

20 Claims, 9 Drawing Sheets

SYSTEM AND METHOD FOR DETECTING A STATOR DISTORTION FILTER IN AN ELECTRICAL POWER SYSTEM

FIELD

The present disclosure relates generally to renewable energy power systems, such as wind turbine, and more particular to a system and method for detecting a stator distortion filter in a renewable energy power system.

BACKGROUND

Wind turbines have received increased attention as a renewable energy source. Wind turbines use the wind to generate electricity. The wind turns multiple rotor blades connected to a rotor. The spin of the rotor blades caused by the wind spins a shaft of the rotor, which connects to a generator that generates electricity. Certain wind turbines include a doubly fed induction generator (DFIG) to convert wind energy into electrical power suitable for output to an electrical grid. DFIGs are typically connected to a power converter that regulates the flow of electrical power between the DFIG and the grid. More particularly, the power converter allows the wind turbine to output electrical power at the grid frequency regardless of the rotational speed of the rotor blades.

A typical DFIG system includes a wind driven DFIG having a rotor and a stator. The stator of the DFIG is coupled to the electrical grid through a stator bus. The power converter is used to couple the rotor of the DFIG to the electrical grid. The power converter can be a two-stage power converter including both a rotor-side converter and a line-side converter. The rotor-side converter can receive alternating current (AC) power from the rotor via a rotor-side bus and can convert the AC power to a DC power. The line-side converter can then convert the DC power to AC power having a suitable output frequency, such as the grid frequency. The AC power is provided to the electrical grid via a line-side bus.

DFIG wind turbine output current contains switching frequency harmonics which are contributed by the line-side converter and the rotor-side converter via the stator path. Harmonics are present in the stator current path due to rotor-side converter switching frequency changes with turbine operation. Passive solutions, such as using a stator distortion filter, have been implemented in the past to reduce the harmonic level.

Accordingly, the present disclosure is directed to a system and method for detecting a stator distortion filter in an electrical power system.

BRIEF DESCRIPTION

Aspects and advantages of embodiments of the present disclosure will be set forth in part in the following description, or may be learned from the description, or may be learned through practice of the embodiments.

In an aspect, the present disclosure is directed to a method of detecting whether a passive load is connected to a generator of an electrical power system. The generator has a rotor and a stator. The method includes temporarily interrupting, via a controller, magnetic flux excitation of the generator. The method also includes observing, via the controller, a sinusoidal waveform of one or more electrical feedbacks of the generator. When the sinusoidal waveform persists longer than a predefined duration, the method includes determining, via the controller, that the passive load is connected to the generator of the electrical power system. When the sinusoidal waveform abruptly decays below a threshold in a time period less than the predefined duration, the method includes determining, via the controller, that the passive load is not connected to the generator of the electrical power system. Further, the method includes implementing, via the controller, a control action based on whether the passive load is connected to the generator of the electrical power system.

In another aspect, the present disclosure is directed to an electrical power system connected to a power grid. The electrical power system includes a generator having a stator and a rotor. The stator is connected to the power grid via a stator power path. The electrical power system further includes a passive load connected to the generator and a power converter having a line-side converter coupled to the power grid via a converter power path and a rotor-side converter coupled to a rotor bus of the rotor and the line-side converter via a DC link. Further, the electrical power system includes a controller having at least one processor configured to perform a plurality of operations, including but not limited to temporarily interrupting magnetic flux excitation of the generator; observing a sinusoidal waveform of one or more electrical feedbacks of the generator; when the sinusoidal waveform persists longer than a predefined duration, determining that the passive load is connected to the generator of the electrical power system; when the sinusoidal waveform abruptly decays below a threshold in a time period less than the predefined duration, determining that the passive load is not connected to the generator of the electrical power system; and implementing a control action based on whether the passive load is connected to the generator of the electrical power system.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
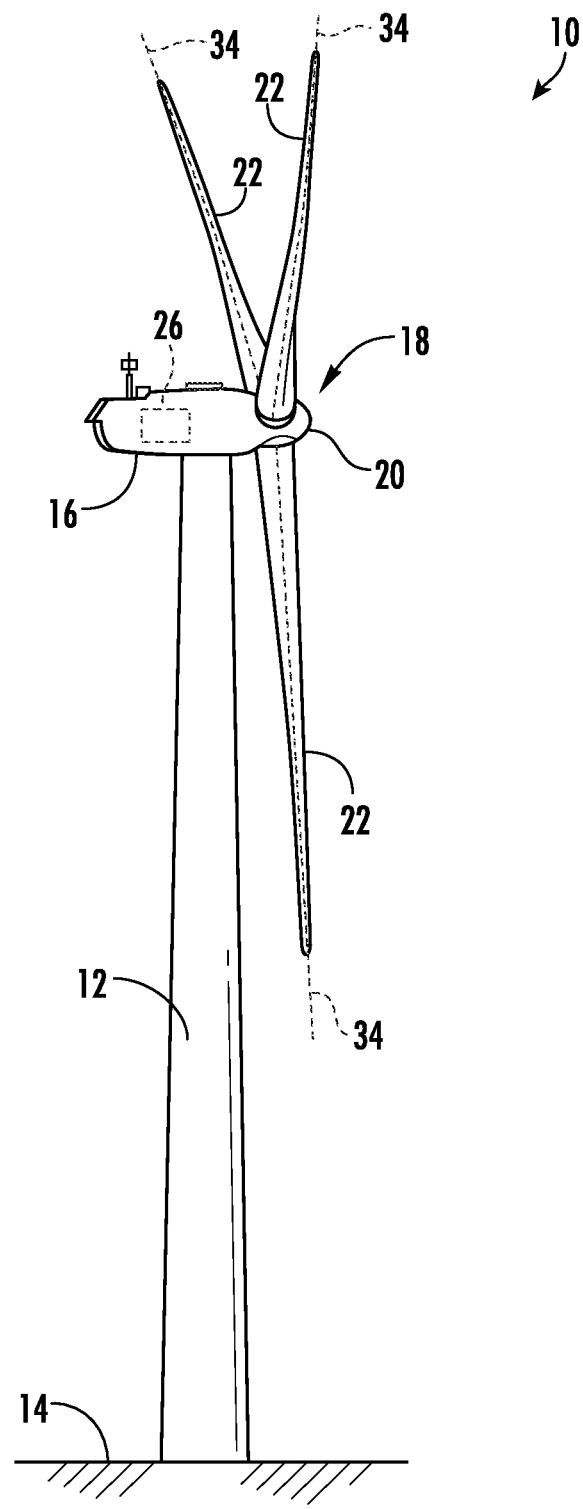
FIG. 1 illustrates a perspective view of a wind turbine according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Referring now to the figures, FIG. 1 illustrates a perspective view of one embodiment of a wind turbine 10 according to the present disclosure. In particular, as shown, the wind turbine 10 includes a tower 12 extending from a support surface 14, a nacelle 16 mounted on the tower 12, and a rotor 18 coupled to the nacelle 16. The rotor 18 includes a rotatable hub 20 and at least one rotor blade 22 coupled to and extending outwardly from the hub 20. For example, in the illustrated embodiment, the rotor 18 includes three rotor blades 22. However, in an alternative embodiment, the rotor 18 may include more or less than three rotor blades 22. Each rotor blade 22 may be spaced about the hub 20 to facilitate rotating the rotor 18 to enable kinetic energy to be transferred from the wind into usable mechanical energy and, subsequently, electrical energy. For instance, the hub 20 may be rotatably coupled to an electric generator 120 of FIG. 2 positioned within the nacelle 16 to permit electrical energy to be produced. The wind turbine 10 may further include a turbine controller 26 utilized to control yaw adjustment of the wind turbine 10, pitch adjustment of the rotor blades 22 about respective pitch axes 34, and/or torque adjustment of the generator 120 of FIG. 2. Further, in an embodiment, the turbine controller 26 may interface with components within the wind turbine 10, such as the converter controller 140 of FIG. 2.

Figure 2:
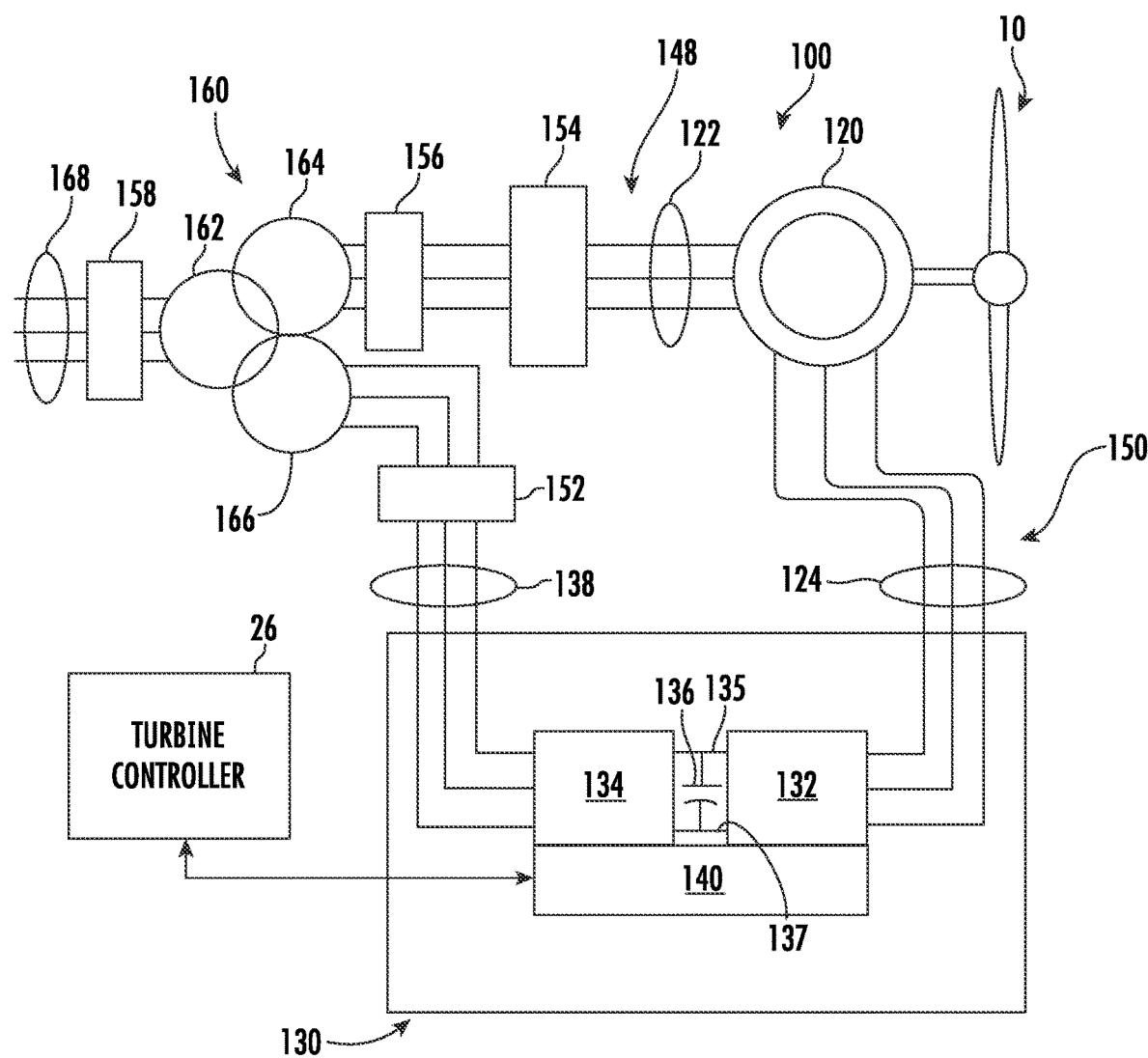
FIG. 2 illustrates an electrical power system according to example embodiments of the present disclosure.

Referring now to FIG. 2, a schematic diagram of an embodiment of a DFIG wind turbine system 100 is illustrated in accordance with aspects of the present disclosure. It should be appreciated that the present disclosure will generally be described herein with reference to the wind turbine system 100 shown in FIG. 2. However, those of ordinary skill in the art, using the disclosures provided herein, should understand that aspects of the present disclosure may also be applicable in other power generation systems.

As shown, the wind turbine system 100 may define a stator power path 148 and a converter power path 150. Further, as shown, the generator 120, e.g., a DFIG, can be coupled to a stator bus 122 and a power converter 130 via a rotor-side bus 124. The stator bus 122 can provide an output multiphase power (e.g., three-phase power) from a stator of generator 120 and the rotor-side bus 124 can provide an output multiphase power (e.g., three-phase power) of the rotor of generator 120. The power converter 130 can have a rotor-side converter 132 and a line-side converter 134. The generator 120 can be coupled via the rotor-side bus 124 to the rotor-side converter 132. The rotor-side converter 132 can be coupled to the line-side converter 134 which in turn can be coupled to a line-side bus 138. The rotor-side converter 132 and the line-side converter 134 can be coupled via a DC link 135, 137 across which is the DC link capacitor 136.

In addition, the power converter 130 may be coupled to a converter controller 140 in order to control the operation of the rotor-side converter 132 and the line-side converter 134. For instance, the converter controller 140 may be configured to operate the rotor-side converter 132 in an overmodulation regime, or close to an overmodulation regime. The converter controller 140 may include any number of control devices. In one embodiment, the control devices may include a processing device (e.g., microprocessor, microcontroller, etc.) executing computer-readable instructions stored in a computer-readable medium. The instructions, when executed by the processing device, may cause the processing device to perform operations, including providing control commands (e.g., switching frequency commands) to the switching elements 142 (FIG. 4) of the power converter 130.

Referring still to FIG. 2, the wind turbine system 100 may include a transformer 160 coupling the wind turbine system 100 to an electrical grid 168. In an embodiment, the transformer 160 may be a three-winding transformer that can include a high voltage (e.g., greater than 12 kVAC) primary winding 162 e.g., coupled to the electrical grid, a medium voltage (e.g., 6 kVAC) secondary winding 164 e.g., coupled to the stator bus 122, and/or a low voltage (e.g., 575 VAC, 690 VAC, etc.) auxiliary winding 166 e.g., coupled to the line-side bus 138. It should be understood that the transformer 160 can be a three-winding transformer as shown, or alternatively may be a two-winding transformer having only a primary winding 162 and a secondary winding 164: may be a four-winding transformer having a primary winding 162, a secondary winding 164, an auxiliary winding 166, and an additional auxiliary winding: or may have any other suitable number of windings.

On the stator bus 122, sinusoidal multi-phase (e.g., three-phase) alternating current (AC) power can be provided from the stator of the generator 120 to the stator bus 122, and from the stator bus 122 to the transformer 160, e.g., to the secondary winding 164 thereof. Various circuit breakers, fuses, contactors, and other devices, such as grid circuit breaker 158, stator bus circuit breaker 156, switch 154, and line-side bus circuit breaker 152, can be included in the wind turbine system 100 to connect or disconnect corresponding buses, for example, when current flow is excessive and can damage components of the wind turbine system 100 or for other operational considerations. Additional protection components can also be included in the wind turbine system 100.

Figure 3:
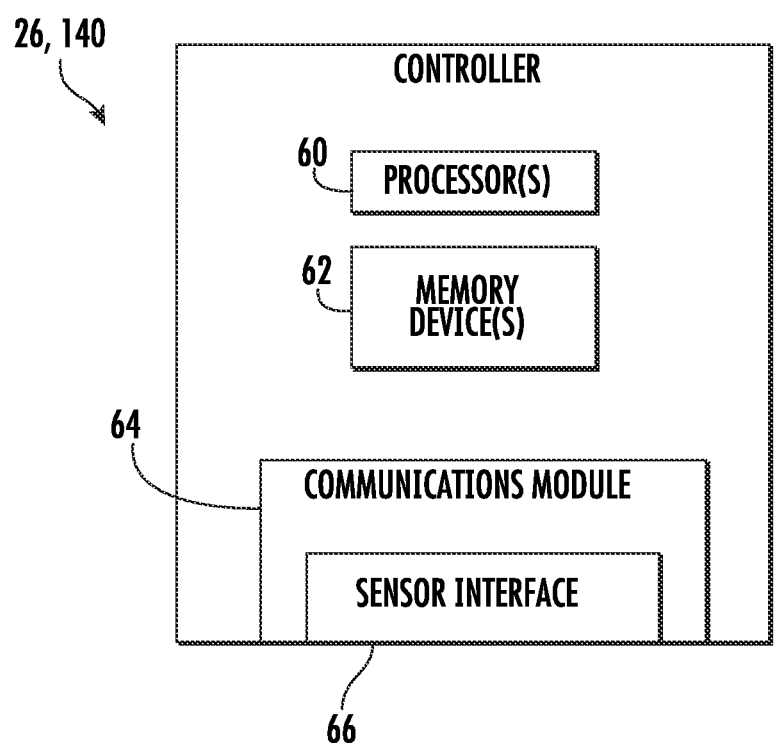
FIG. 3 illustrates a schematic diagram of suitable components that may be included within a controller of a wind turbine and/or electrical power system and/or a controller of a power converter according to example embodiments of the present disclosure.

Referring now to FIG. 3, a block diagram of an embodiment of suitable components (e.g., one or more control devices) that may be included within the turbine controller 26 and/or the converter controller 140 according to the present disclosure is illustrated. As shown, the controller 26, 140 may include one or more processor(s) 60 and associated memory device(s) 62 configured to perform a variety of computer-implemented functions (e.g., performing the methods, steps, calculations, and the like disclosed herein). Additionally, the controller 26, 140 may also include a communications module 64 to facilitate communications between the controller 26, 140 and the various components of the wind turbine 10. For instance, the communications module 64 may serve as an interface to permit the turbine controller 26 to transmit control signals to one or more pitch adjustment mechanisms to, for instance, control the pitch of the rotor blades 22. The communications module 64 may additionally and/or alternatively serve as an interface to permit the turbine controller 26 to transmit signals (e.g., control signals or status signals) to the converter controller 140. The communications module 64 may additionally and/or alternatively serve to permit the converter controller 140 to provide control signals to the power converter 130. Moreover, the communications module 64 may include a sensor interface 66 (e.g., one or more analog-to-digital converters) to permit input signals transmitted from, for example, various sensors such as voltage sensors and current sensors, to be converted into signals that can be understood and processed by the processor(s) 60.

Figure 4:
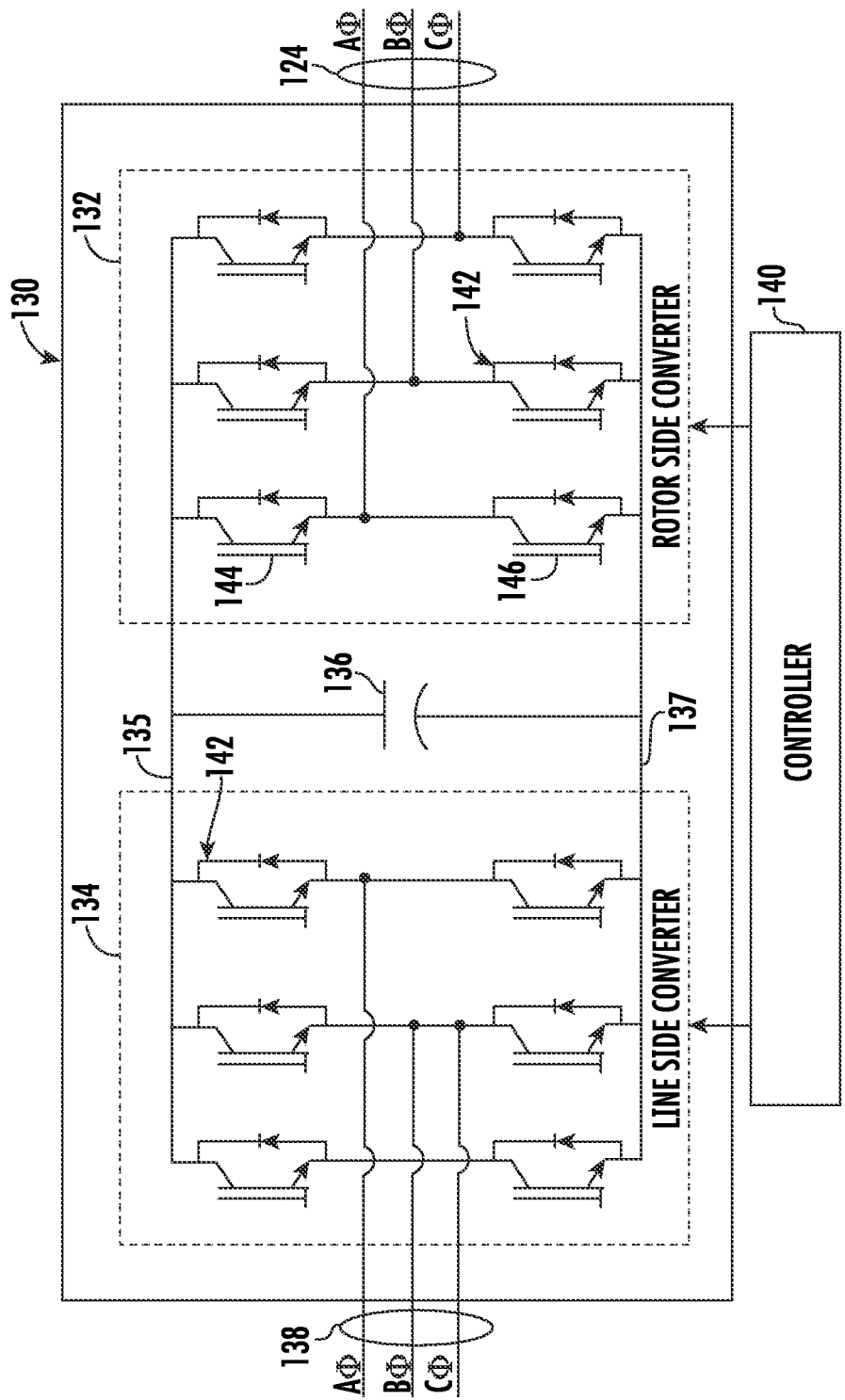
FIG. 4 illustrates a schematic diagram of an example power converter suitable for use with the wind turbine system according to example embodiments of the present disclosure.

Referring now to FIG. 4, a schematic diagram of an example embodiment of the power converter 130 shown in FIG. 2 is illustrated in accordance with aspects of the present disclosure. As shown, the rotor-side converter 132 includes parallel bridges having a plurality of bridge circuits, with each phase of the rotor-side bus 124 input to the rotor-side converter 132 being coupled to a single bridge circuit. In addition, the line-side converter 134 may also include parallel bridges having a plurality of bridge circuits. Similar to the rotor-side converter 132, the line-side converter 134 also includes a single bridge circuit for each output phase of the line-side converter 134.

Each bridge circuit may generally include a plurality of switching elements (e.g., IGBTs) 142 coupled in series with one another. For instance, as shown in FIG. 4, each bridge circuit includes an upper switching element 144 and a lower switching element 146. In addition, a diode may be coupled in parallel with each of the switching elements 142. In alternative embodiments, parallel switching elements 142 and diodes may be used to increase the current rating of the converter. As is generally understood, the line-side converter 134 and the rotor-side converter 132 may be controlled, for instance, by providing control commands, using a suitable driver circuit, to the gates of the switching elements 142. For example, the converter controller 140 may provide suitable gate timing commands to the gates of the switching elements 142 of the bridge circuits. The control commands may control the switching frequency of the switching elements 142 to provide a desired output. It should be appreciated by those of ordinary skill in the art that the power converter 130 may include any suitable switching elements 142, such as insulated gate bipolar transistors (IGBTs), insulated gate commuted thyristors, MOSFETs (e.g., Silicon or Silicon Carbide based MOSFETs), bipolar transistors, silicon controlled rectifiers, or other suitable switching elements.

Figure 5:
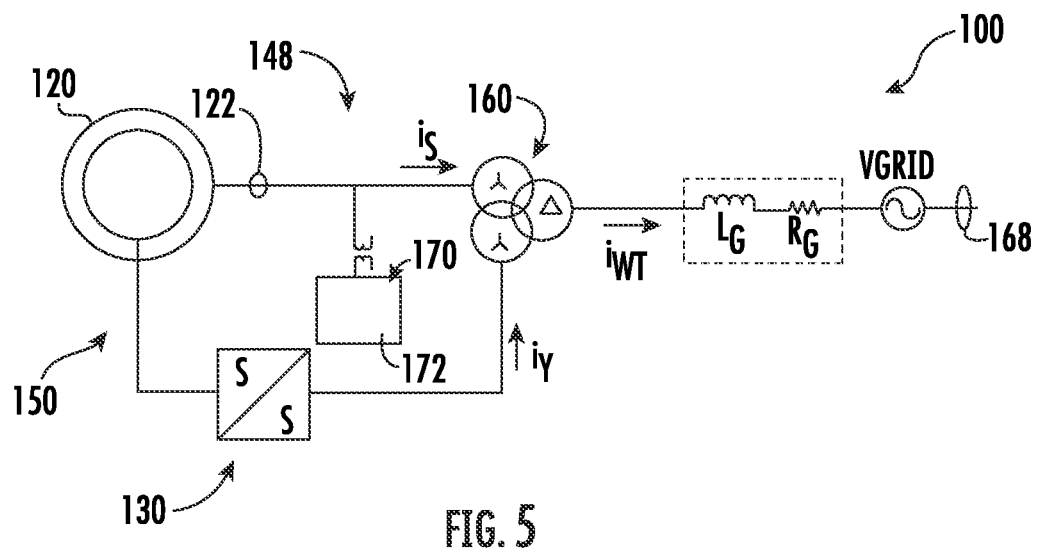
FIG. 5 illustrates a simplified, schematic circuit of part of the wind turbine system of FIG. 2 is illustrated in accordance with aspects of the present disclosure.

Referring now to FIG. 5, a simplified, schematic circuit of part of the wind turbine system 100 of FIG. 2 is illustrated in accordance with aspects of the present disclosure. In particular, as shown, the wind turbine system 100 includes a passive load 170 coupled to the stator power path 148 connecting the stator of the generator 120 to the power grid 168. In particular, as shown and previously described, the passive load 170 may be the stator distortion filter 172 coupled in parallel with the stator power path 148. Thus, as described herein, the stator distortion filter 172 may be provided to mitigate high frequency harmonics in an output current ($i_{WT}$) of the wind turbine system 100. In particular, as shown, the output current ($i_{WT}$) of the wind turbine system 100 generally includes a stator current ($i_S$) and converter current ($i_Y$). For instance, as shown in FIG. 5, the stator distortion filter 172 can be coupled to the stator bus 122, i.e., between the generator stator and the transformer 160.

Figure 6:
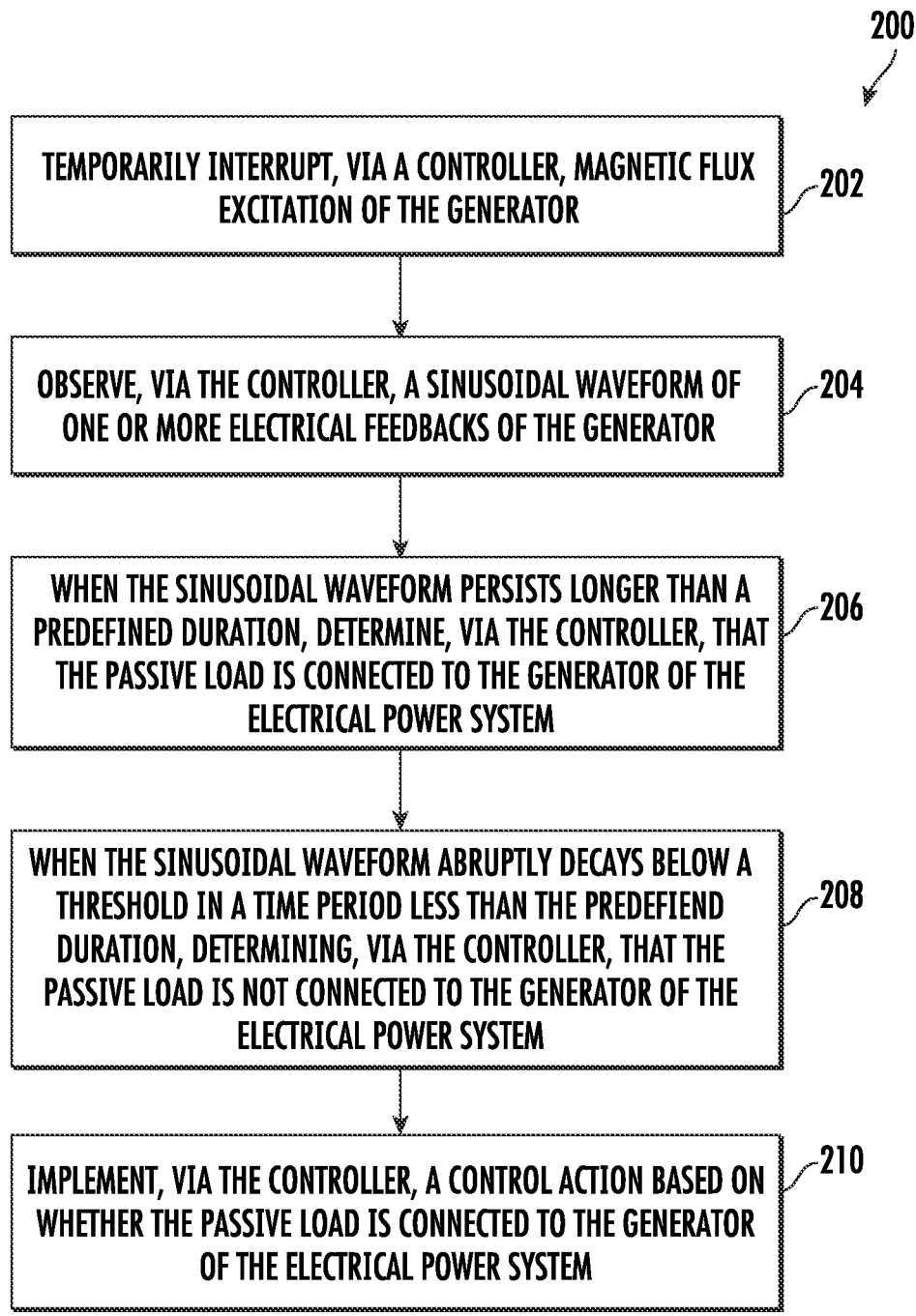
FIG. 6 illustrates a flow diagram of an embodiment of a method of detecting whether a passive load, such as a stator distortion filter, is connected to a generator of an electrical power system in accordance with aspects of the present disclosure.

Referring now to FIG. 6, a flow diagram of an embodiment of a method 200 of detecting whether a passive load is connected to a generator of an electrical power system is illustrated in accordance with aspects of the present disclosure. For example, in an embodiment, the passive load includes a stator distortion filter in a stator power path connecting the stator of the generator to an electrical grid.

As used herein the electrical power system may include the wind turbine power system 100, a solar power system, an energy storage power system, or a hybrid power system containing combinations thereof. In general, the method 200 will be described herein as being implemented using a controller of a wind turbine system, such as the turbine controller 26 or the converter controller 140 of the DFIG wind turbine system 100 described above with reference to FIGS. 1-4. However, it should be appreciated that the disclosed method 200 may be implemented using any other suitable power generation system that is configured to supply power for application to a load. In addition, although FIG. 6 depicts steps performed in a particular order for purposes of illustration and discussion, the methods described herein are not limited to any particular order or arrangement. One skilled in the art, using the disclosures provided herein, will appreciate that various steps of the methods can be omitted, rearranged, performed simultaneously, combined and/or adapted in various ways. Additional steps not disclosed herein may be performed without departing from the scope or spirit of the present disclosure.

As shown at (202), the method 200 includes temporarily interrupting, via a controller, magnetic flux excitation of the generator. For example, in an embodiment, wherein temporarily interrupting the magnetic flux excitation of the generator 120 may include using a grid/stator synchronization sequence to temporarily interrupt the magnetic flux excitation of the generator 120. More specifically, in an embodiment, the grid/stator synchronization sequence may include setting a zero current excitation in a rotor circuit of the generator 120.

Referring back to FIG. 6, as shown at (204), the method 200 includes observing, via the controller, a sinusoidal waveform of one or more electrical feedbacks of the generator. For example, in an embodiment, the electrical feedback(s) of the generator 120 may be stator voltage feedbacks, stator current feedbacks, or both, or any other suitable electrical feedback of the generator 120.

As shown at (206), when the sinusoidal waveform persists longer than a predefined duration, the method 200 includes determining, via the controller, that the passive load is connected to the generator of the electrical power system. In an embodiment, the predefined duration may be equal to or less than about 10 milliseconds. As shown at (208), when the sinusoidal waveform abruptly decays below a threshold in a time period less than the predefined duration, the method 200 includes determining, via the controller, that the passive load is not connected to the generator of the electrical power system.

As shown at (210), the method 200 includes implementing, via the controller, a control action based on whether the passive load is connected to the generator of the electrical power system. For example, in an embodiment, implementing the control action based on whether the passive load is connected to the generator 120 may include connecting the passive load to the generator 120 after the controller determines the passive load is not connected to the generator 120. Moreover, in an embodiment, implementing the control action based on whether the passive load is connected to the generator 120 may include determining whether the power converter 130 is configured to operate with the passive load connected to the generator 120. If the power converter 130 is configured to operate with the passive load connected to the generator 120, operating the power converter to account for the passive load being connected to the generator 120.

Figure 7:
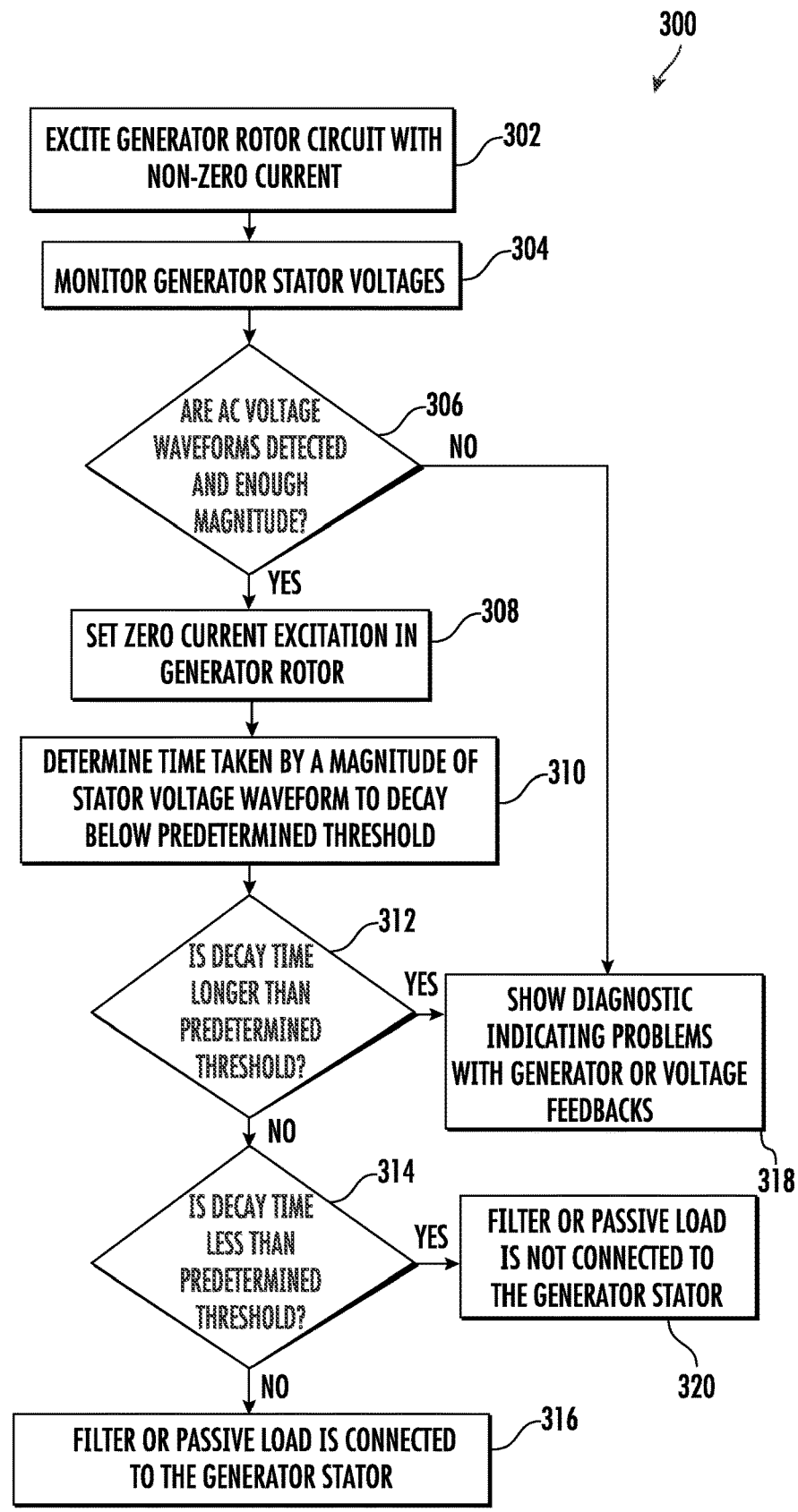
FIG. 7 illustrates a flow diagram of an embodiment of an algorithm of detecting whether a stator distortion filter is connected to a generator of a wind turbine power system in accordance with aspects of the present disclosure.

The method 200 of FIG. 6 can be better understood with reference to FIGS. 7-9D. In particular, FIG. 7 illustrates a flow diagram of a particular embodiment of an algorithm 300 of detecting whether the stator distortion filter 172 is connected to the generator 120 of the wind turbine power system 100 in accordance with aspects of the present disclosure: FIGS. 8A-8D illustrate various graphs of sinusoidal waveforms of stator voltage feedbacks according to the present disclosure, in which a stator distortion filter is connected to the generator 120; and FIGS. 9A-9D illustrate various graphs of sinusoidal waveforms of stator voltage feedbacks according to the present disclosure, in which a stator distortion filter is not connected to the generator 120.

Referring particularly to FIG. 7, as shown at (302), the algorithm 300 includes exciting the rotor circuit of the generator 120 with a non-zero current. As shown at (304), the algorithm 300 includes monitoring the stator voltage feedbacks of the generator 120. As shown at (306), the algorithm 300 includes determining whether a sinusoidal voltage waveform is detected in the stator voltage feedbacks and has a high enough magnitude. If the sinusoidal voltage waveform is not detected and/or does not have a high enough magnitude, as shown at (318), the algorithm 300 includes generating a diagnostic signal indicating an error associated with the generator 120.

However, when the sinusoidal voltage waveform is detected and has a high enough magnitude, as shown at (308), the algorithm 300 includes setting zero current excitation in the rotor circuit of the generator 120. Furthermore, and continuing to (310), the algorithm 300 includes determining a time taken by a magnitude of the sinusoidal voltage waveform to decay below a predetermined threshold. The algorithm 300 further includes comparing the time taken by the magnitude of the sinusoidal voltage waveform to decay below the predetermined threshold to a predefined duration. Thus, as shown at (312), the algorithm 300 determines whether the decay time is longer than the predefined duration. If so, as shown at (318), the algorithm 300 includes generating a diagnostic signal indicating an error associated with the generator 120. In contrast, as shown at (314), if the decay time is less than the predefined duration, then the algorithm 300 continues to or (316) and (320). More specifically, as shown at (316), if the decay time is not less than the predefined duration, the algorithm 300 determines that the filter or passive load (e.g., the stator distortion filter 172) is connected to the generator stator. If the decay time is less than the predefined duration, as shown at (320), the algorithm 300 includes determining that the filter or passive load (e.g., the stator distortion filter 172) is not connected to the generator stator.

Figure 8A:
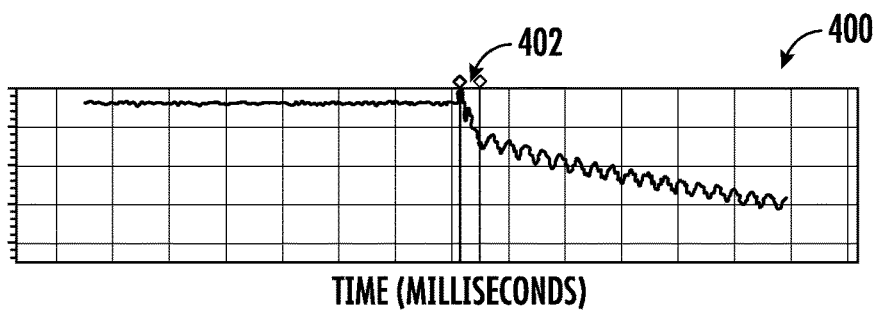
FIGS. 8A-8D illustrate various graphs of sinusoidal voltage waveforms of stator voltage feedbacks according to the present disclosure, in which a stator distortion filter is connected to a generator.
Figure 8B:
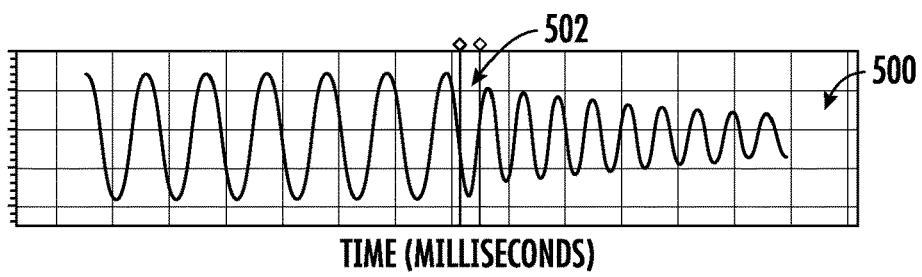
Figure 8C:
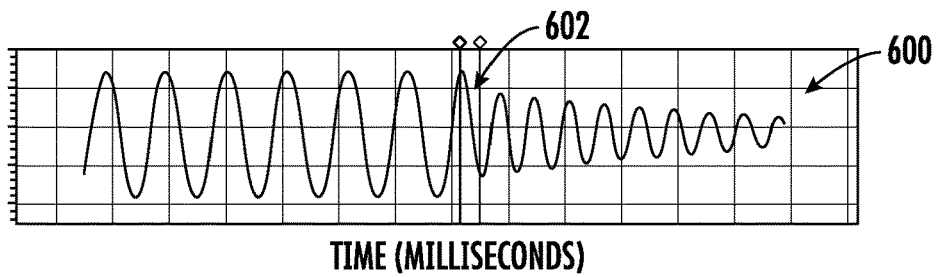
Figure 8D:
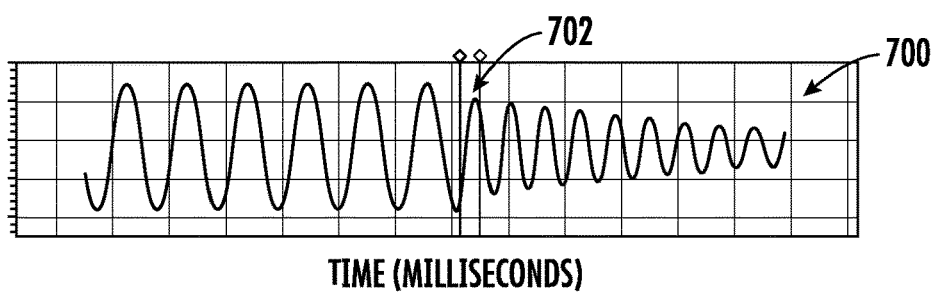
Figure 9A:
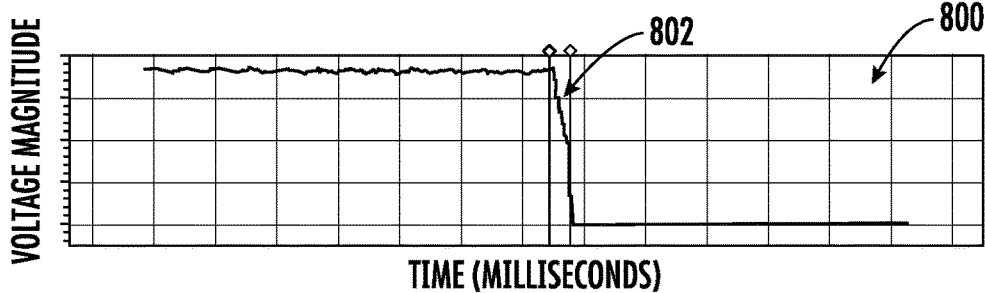
FIGS. 9A-9D illustrate various graphs of sinusoidal voltage waveforms of stator voltage feedbacks according to the present disclosure, in which a stator distortion filter is not connected to a generator.
Figure 9B:
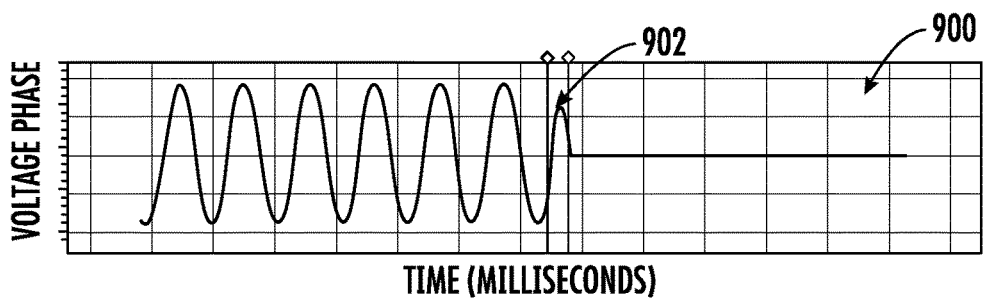
Figure 9C:
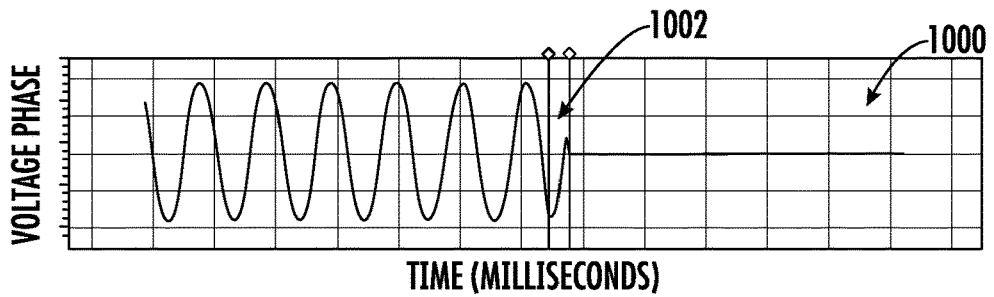
Figure 9D:
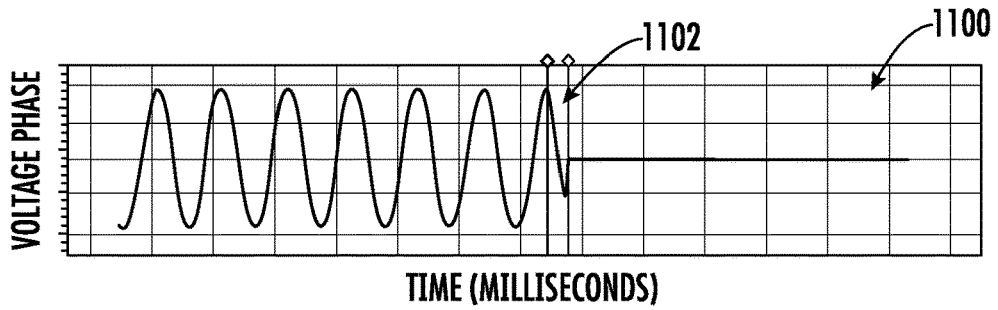

Referring now to FIGS. 8A-9D, as mentioned, various graphs 400, 500, 600, 700, 800, 900, 1000, 1100 of sinusoidal waveforms of stator voltage feedbacks according to the present disclosure, in which a stator distortion filter is connected to the generator 120 (FIGS. 8A-8D) and in which the stator distortion filter is not connected to the generator 120 (FIGS. 9A-9D) are illustrated. More specifically, as shown, FIGS. 8A-9D illustrate a comparison between stator voltage feedbacks captured in a wind turbine power system, having a connected stator distortion filter (FIGS. 8A-8D), and having no such stator distortion filter (FIGS. 9A-9D). In particular, FIGS. 8A and 9A illustrate the stator voltage rotating-vector magnitude, whereas FIGS. 8B-8D and 9B-9D illustrate stator line-to-neutral phase voltages. All graphs are in units of Volts. Moreover, as shown, the decaying envelope 402, 502, 602, 702, 802, 902, 1002, 1102 in each of FIGS. 8A-9D is clearly different between systems having a connected stator distortion filter (FIGS. 8A-8D) and those with no such stator distortion filter (FIGS. 9A-9D). Thus, the difference can be robustly detected by the algorithm(s) described herein. Furthermore, as shown, the delta between cursors is the time that the phase voltages take to reach near zero levels, when there is no distortion filter connected (FIGS. 9A-9D). Moreover, as shown in FIGS. 8A-8D, voltage of significant magnitude and still oscillating is sensed when the connected stator distortion filter and generator continue exchanging energy after rotor excitation is removed.

Further aspects of the invention are provided by the subject matter of the following clauses:

A method of detecting whether a passive load is connected to a generator of an electrical power system, the generator having a rotor and a stator, the method comprising: temporarily interrupting, via a controller, magnetic flux excitation of the generator; observing, via the controller, a sinusoidal waveform of one or more electrical feedbacks of the generator; when the sinusoidal waveform persists longer than a predefined duration, determining, via the controller, that the passive load is connected to the generator of the electrical power system; when the sinusoidal waveform abruptly decays below a threshold in a time period less than the predefined duration, determining, via the controller, that the passive load is not connected to the generator of the electrical power system; and implementing, via the controller, a control action based on whether the passive load is connected to the generator of the electrical power system.

The method of any preceding clause, wherein the passive load comprises a stator distortion filter in a stator power path connecting the stator of the generator to an electrical grid.

The method of any preceding clause, wherein temporarily interrupting the magnetic flux excitation of the generator further comprises using a synchronization sequence to temporarily interrupt the magnetic flux excitation of the generator.

The method of any preceding clause, wherein the synchronization sequence further comprises setting a zero current excitation in a rotor circuit of the generator.

The method of any preceding clause, wherein the one or more electrical feedbacks of the generator comprises one or more stator voltage feedbacks, one or more stator current feedbacks, or both.

The method of any preceding clause, wherein the one or more electrical feedbacks of the generator comprises the stator voltage feedbacks.

The method of any preceding clause, wherein implementing the control action based on whether the passive load is connected to the generator of the electrical power system further comprises connecting the passive load to the generator after the controller determines the passive load is not connected to the generator.

The method of any preceding clause, wherein implementing the control action based on whether the passive load is connected to the generator of the electrical power system further comprises: determining whether a power converter of the electrical power system is configured to operate with the passive load connected to the generator; and when the power converter is configured to operate with the passive load connected to the generator, operating the power converter to account for the passive load being connected to the generator.

The method of any preceding clause, further comprising: exciting a rotor circuit of the generator with a non-zero current before temporarily interrupting the magnetic flux excitation of the generator; monitoring the one or more electrical feedbacks of the generator before temporarily interrupting the magnetic flux excitation of the generator; and determining whether the sinusoidal waveform is detected and has a magnitude exceeding a predetermined threshold before temporarily interrupting the magnetic flux excitation of the generator.

The method of any preceding clause, further comprising: determining a time taken by a magnitude of the sinusoidal waveform to decay below the threshold; and comparing the time taken by the magnitude of the sinusoidal waveform to decay below the threshold to the predefined duration.

The method of any preceding clause, wherein implementing the control action based on whether the passive load is connected to the generator of the electrical power system further comprises: generating a diagnostic signal indicating an error associated with the generator when the time taken by the magnitude of the sinusoidal waveform to decay below the threshold is longer than the predefined duration.

The method of any preceding clause, wherein the predefined duration is equal to or less than about 10 milliseconds.

The method of any preceding clause, wherein the electrical power system comprises at least one of a wind turbine power system, a solar power system, an energy storage power system, or combinations thereof.

The method of any preceding clause, wherein the controller comprises at least one of a turbine controller or a converter controller of the wind turbine power system.

An electrical power system connected to a power grid, the electrical power system comprising: a generator comprising a stator and a rotor, the stator connected to the power grid via a stator power path; a passive load connected to the generator; a power converter comprising a line-side converter coupled to the power grid via a converter power path and a rotor-side converter coupled to a rotor bus of the rotor and the line-side converter via a DC link; a controller comprising at least one processor, the at least one processor configured to perform a plurality of operations, the plurality of operations comprising: temporarily interrupting magnetic flux excitation of the generator; observing a sinusoidal waveform of one or more electrical feedbacks of the generator; when the sinusoidal waveform persists longer than a predefined duration, determining that the passive load is connected to the generator of the electrical power system; when the sinusoidal waveform abruptly decays below a threshold in a time period less than the predefined duration, determining that the passive load is not connected to the generator of the electrical power system; and implementing a control action based on whether the passive load is connected to the generator of the electrical power system.

The electrical power system of any preceding clause, wherein the passive load comprises a stator distortion filter in the stator power path connecting the stator of the generator to an electrical grid.

The electrical power system of any preceding clause, wherein temporarily interrupting the magnetic flux excitation of the generator further comprises using a synchronization sequence to temporarily interrupt the magnetic flux excitation of the generator, wherein the synchronization sequence further comprises setting a zero current excitation in a rotor circuit of the rotor of the generator.

The electrical power system of any preceding clause, wherein the one or more electrical feedbacks of the generator comprises one or more stator voltage feedbacks, one or more stator current feedbacks, or both.

The electrical power system of any preceding clause, wherein implementing the control action based on whether the passive load is connected to the generator of the electrical power system further comprises: connecting the passive load to the generator after the controller determines the passive load is not connected to the generator; determining whether a power converter of the electrical power system is configured to operate with the passive load connected to the generator; and when the power converter is configured to operate with the passive load connected to the generator, operating the power converter to account for the passive load being connected to the generator.

The electrical power system of any preceding clause, wherein the plurality of operations further comprise: determining a time taken by a magnitude of the sinusoidal waveform to decay below the threshold; and comparing the time taken by the magnitude of the sinusoidal waveform to decay below the threshold to the predefined duration; and wherein implementing the control action based on whether the passive load is connected to the generator of the electrical power system further comprises: generating a diagnostic signal indicating an error associated with the generator when the time taken by the magnitude of the sinusoidal waveform to decay below the threshold is longer than the predefined duration.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of detecting whether a passive load is connected to a generator of an electrical power system, the generator having a rotor and a stator, the method comprising:
    temporarily interrupting, via a controller, magnetic flux excitation of the generator;
    observing, via the controller, a sinusoidal waveform of one or more electrical feedbacks of the generator;
    when the sinusoidal waveform persists longer than a predefined duration, determining, via the controller, that the passive load is connected to the generator of the electrical power system;
    when the sinusoidal waveform abruptly decays below a threshold in a time period less than the predefined duration, determining, via the controller, that the passive load is not connected to the generator of the electrical power system; and implementing, via the controller, a control action based on whether the passive load is connected to the generator of the electrical power system.

2. The method of claim 1, wherein the passive load comprises a stator distortion filter in a stator power path connecting the stator of the generator to an electrical grid.

3. The method of claim 1, wherein temporarily interrupting the magnetic flux excitation of the generator further comprises using a synchronization sequence to temporarily interrupt the magnetic flux excitation of the generator.

4. The method of claim 3, wherein the synchronization sequence further comprises setting a zero current excitation in a rotor circuit of the generator.

5. The method of claim 1, wherein the one or more electrical feedbacks of the generator comprises one or more stator voltage feedbacks, one or more stator current feedbacks, or both.

6. The method of claim 5, wherein the one or more electrical feedbacks of the generator comprises the stator voltage feedbacks.

7. The method of claim 1, wherein implementing the control action based on whether the passive load is connected to the generator of the electrical power system further comprises connecting the passive load to the generator after the controller determines the passive load is not connected to the generator.

8. The method of claim 6, wherein implementing the control action based on whether the passive load is connected to the generator of the electrical power system further comprises:
    determining whether a power converter of the electrical power system is configured to operate with the passive load connected to the generator; and
    when the power converter is configured to operate with the passive load connected to the generator, operating the power converter to account for the passive load being connected to the generator.

9. The method of claim 1, further comprising:
    exciting a rotor circuit of the generator with a non-zero current before temporarily interrupting the magnetic flux excitation of the generator;
    monitoring the one or more electrical feedbacks of the generator before temporarily interrupting the magnetic flux excitation of the generator; and
    determining whether the sinusoidal waveform is detected and has a magnitude exceeding a predetermined threshold before temporarily interrupting the magnetic flux excitation of the generator.

10. The method of claim 1, further comprising:
    determining a time taken by a magnitude of the sinusoidal waveform to decay below the threshold; and
    comparing the time taken by the magnitude of the sinusoidal waveform to decay below the threshold to the predefined duration.

11. The method of claim 10, wherein implementing the control action based on whether the passive load is connected to the generator of the electrical power system further comprises:
    generating a diagnostic signal indicating an error associated with the generator when the time taken by the magnitude of the sinusoidal waveform to decay below the threshold is longer than the predefined duration.

12. The method of claim 1, wherein the predefined duration is equal to or less than about 10 milliseconds.

13. The method of claim 1, wherein the electrical power system comprises at least one of a wind turbine power system, a solar power system, an energy storage power system, or combinations thereof.

14. The method of claim 13, wherein the controller comprises at least one of a turbine controller or a converter controller of the wind turbine power system.

15. An electrical power system connected to a power grid, the electrical power system comprising:
    a generator comprising a stator and a rotor, the stator connected to the power grid via a stator power path;
    a passive load connected to the generator;
    a power converter comprising a line-side converter coupled to the power grid via a converter power path and a rotor-side converter coupled to a rotor bus of the rotor and the line-side converter via a DC link;
    a controller comprising at least one processor, the at least one processor configured to perform a plurality of operations, the plurality of operations comprising:
        temporarily interrupting magnetic flux excitation of the generator;
        observing a sinusoidal waveform of one or more electrical feedbacks of the generator;
        when the sinusoidal waveform persists longer than a predefined duration, determining that the passive load is connected to the generator of the electrical power system;
        when the sinusoidal waveform abruptly decays below a threshold in a time period less than the predefined duration, determining that the passive load is not connected to the generator of the electrical power system; and
        implementing a control action based on whether the passive load is connected to the generator of the electrical power system.

16. The electrical power system of claim 15, wherein the passive load comprises a stator distortion filter in the stator power path connecting the stator of the generator to an electrical grid.

17. The electrical power system of claim 15, wherein temporarily interrupting the magnetic flux excitation of the generator further comprises using a synchronization sequence to temporarily interrupt the magnetic flux excitation of the generator, wherein the synchronization sequence further comprises setting a zero current excitation in a rotor circuit of the rotor of the generator.

18. The electrical power system of claim 15, wherein the one or more electrical feedbacks of the generator comprises one or more stator voltage feedbacks, one or more stator current feedbacks, or both.

19. The electrical power system of claim 15, wherein implementing the control action based on whether the passive load is connected to the generator of the electrical power system further comprises:
    connecting the passive load to the generator after the controller determines the passive load is not connected to the generator;
    determining whether a power converter of the electrical power system is configured to operate with the passive load connected to the generator; and
    when the power converter is configured to operate with the passive load connected to the generator, operating the power converter to account for the passive load being connected to the generator.

20. The electrical power system of claim 15, wherein the plurality of operations further comprise:
    determining a time taken by a magnitude of the sinusoidal waveform to decay below the threshold; and comparing the time taken by the magnitude of the sinusoidal waveform to decay below the threshold to the predefined duration; and wherein implementing the control action based on whether the passive load is connected to the generator of the electrical power system further comprises:

generating a diagnostic signal indicating an error associated with the generator when the time taken by the magnitude of the sinusoidal waveform to decay below the threshold is longer than the predefined duration.

* * * * *